United States Patent
Capps, Jr. et al.

[11] Patent Number: 5,953,243
[45] Date of Patent: Sep. 14, 1999

[54] MEMORY MODULE IDENTIFICATION

[75] Inventors: Louis Bennie Capps, Jr., Round Rock; Robert Christopher Dixon, Austin; Van Hoa Lee, Cedar Park; Thoi Nguyen, Austin, all of Tex.

[73] Assignee: International Business Machines Corporation, Armonk, N.Y.

[21] Appl. No.: 09/164,131

[22] Filed: Sep. 30, 1998

[51] Int. Cl.⁶ .................................................. G11C 5/02
[52] U.S. Cl. ................................................ 365/52; 365/63
[58] Field of Search .................................. 365/52, 63, 51

[56] References Cited

U.S. PATENT DOCUMENTS

| | | | |
|---|---|---|---|
| 5,237,674 | 8/1993 | Mohme et al. | 365/52 |
| 5,301,278 | 4/1994 | Bowater et al. | 395/275 |
| 5,513,135 | 4/1996 | Dell et al. | 365/52 |
| 5,532,954 | 7/1996 | Bechtolsheim et al. | 365/52 |
| 5,661,677 | 8/1997 | Rondeau, II et al. | 365/52 |
| 5,721,860 | 2/1998 | Stolt et al. | 395/432 |
| 5,727,782 | 3/1998 | Okada | 271/121 |

*Primary Examiner*—Son T. Dinh
*Attorney, Agent, or Firm*—Robert V. Wilder; Leslie A. Vanleeuwen

[57] ABSTRACT

A computer system includes a memory subsystem which has DIMM slots capable of receiving both DRAM and SDRAM memory module devices. A memory device detection methodology detects the presence of installed memory modules in the memory module slots, and signal levels on predetermined pins of the installed memory modules are processed to identify the specific type of memory module installed. The mode of an associated memory controller is set according to the type of module detected to be present, and the characteristics for the memory module are read.

17 Claims, 4 Drawing Sheets

| DEVICE | SA2 | SA1 | SA0 |
|---|---|---|---|
| 401 | 0 | 0 | 0 |
| 403 | 0 | 0 | 1 |
| 405 | 0 | 1 | 0 |
| 407 | 0 | 1 | 1 |

MEMORY MODULE IDENTIFICATION

FIELD OF THE INVENTION

The present invention relates generally to information processing systems and more particularly to a method and apparatus for identifying the memory modules present in a memory subsystem.

BACKGROUND OF THE INVENTION

Many computer systems have a significant investment in memory subsystems, especially in the case of workstations and servers. Often, the memory investment exceeds the investment in the CPU (central processing unit) components of the computer system. As CPU performance increases, many computer system users decide to upgrade the CPU but to retain the existing memory components.

With the rapid advancement in memory technology, computer systems must be developed for current technologies and they must also continue to support previous technologies. For desktop and other computer systems, memory technology has advanced from DRAMs (Dynamic Random Access Memories) to SDRAMs (Synchronous DRAMs). With DRAM technology, many actuating signals for example, are generated only after earlier timing signals have been provided when the actuating signals are derived from the earlier timing signals. Accordingly, timing was not a critical consideration for most applications. However, with synchronous systems, and particularly with SDRAMs, signal propagation is accomplished in strict accordance with clock signals and all timing and actuation signals must be completed at a particular predetermined time relative to a main clock signal.

The computer industry has standardized on a DIMM (dual inline memory module) interface to basic memory DIMM components. The DIMM interface allows for a specified 168 pin connection to either DRAM devices or SDRAM devices. Since these DIMM slots will accept both DRAM DIMMs and also SDRAM DIMMs, and since many of the signals present on the pins are different depending upon the type of a DIMM that is plugged into the DIMM slot, it is necessary for a computer system to be able to detect if a DIMM device is being used, and if so, which kind of DIMM device is being used in a particular memory subsystem slot. More specifically, the standard 168 pin definition for the buffered EDO (Extended Data Out) DRAM DIMMs and the buffered SDRAM DIMMs have conflicting pin definitions in the presence detection area which is used to determine the memory type and size.

Thus, there is a need for an improved method and implementing system for detecting the presence of a memory module in a memory subsystem and to further be able to detect the particular type of a memory device being used.

SUMMARY OF THE INVENTION

A method and implementing memory device detection system is provided in which the presence of installed memory modules in memory module slots is detected, and signal levels on predetermined pins of the installed memory modules are processed to identify a specific type of memory module. In an exemplary embodiment, a memory controller mode is set according to the type of memory detected, and the characteristics for the specific type of detected memory device are read.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Figure 1:
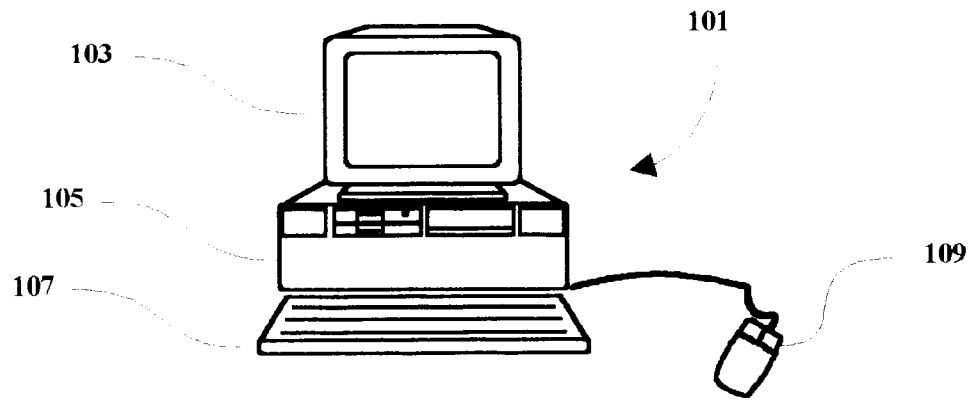
FIG. 1 is an illustration of a computer system in which the present invention may be implemented.

Of the eight (8) presence detection bits used for older memory subsystems, only a subset of four (4) bits are implemented in the following exemplary embodiment to define the size of the memory DIMM necessary for the memory controller initialization. The code of all "1"s returned for the 128 Mb DIMMs is the same pattern as is returned when no DIMM is installed in the memory slot. To resolve that uncertainty, the presence bit #8 (PD8) which is always a "0" for the supported memory types, is connected to a pull-up resistor when EDO or DRAM memory determination is active. The PD8 pin is also the SDRAM vital product data (VPD) ROM address bit #1 (VPDA1). So a pull-up resistor cannot be on all of these pins. Where the VPD address has VPDA1 high, a pull-up resistor is used. Where the VPD ROM address has VPDA1 low, the pull-up resistor is selectively enabled only when EDO memory is being tested. This methodology provides a status bit that indicates if memory is installed in a memory slot or not for the case of EDO DRAM DIMMs.

The various methods discussed herein may be implemented within a typical computer system which may be, for example, a workstation or personal computer 101. In general, an implementing computer system may include a plurality of processors in a multi-bus system in a network of similar systems. However, since the workstation or computer system 101 implementing the present invention in an exemplary embodiment, is generally known in the art and composed of electronic components and circuits which are also generally known to those skilled in the art, circuit details beyond those shown in the drawings are not specified to any greater extent than that considered necessary as illustrated, for the understanding and appreciation of the underlying concepts of the present invention and in order not to obfuscate or distract from the teachings of the present invention.

In FIG. 1, the computer system includes a display device 103 and an electronics enclosure 103 which is typically arranged for housing one or more CPUs (central processing units) along with other component devices and subsystems of the computer system 101. Typically such component devices and subsystems are mounted on circuit boards or circuit cards within the enclosure 103. The computer system 101 also includes a keyboard 107 and a mouse or pointing device 109, which are all interconnected within the illustrated computer system.

Figure 2:
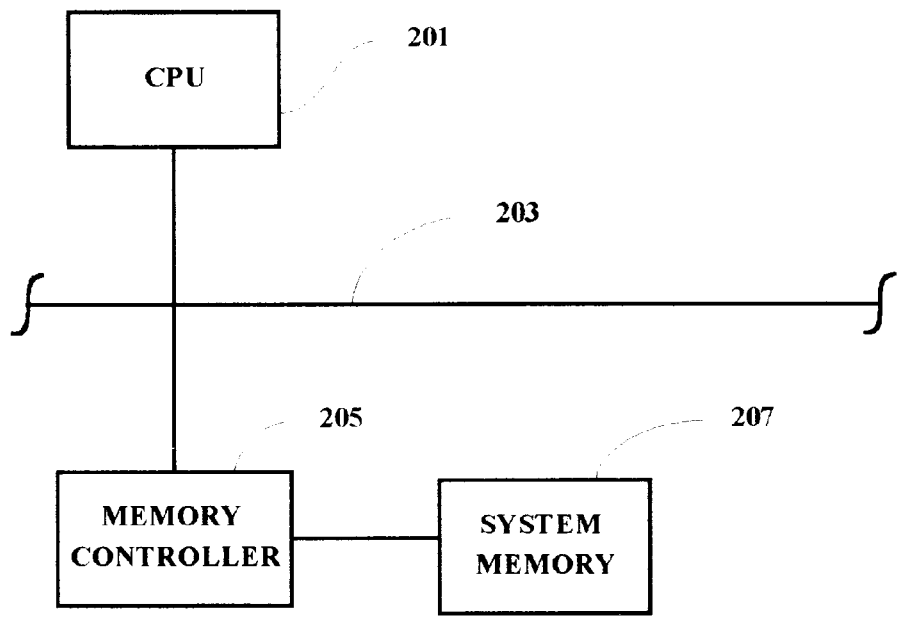
FIG. 2 is a partial schematic diagram of a computer system illustrating the memory system therein.

As shown in FIG. 2, an exemplary computer system includes one or more CPUs such as CPU 201. CPU 101 is connected to a system bus 203. Computer systems also include a memory subsystem including a memory controller 205 connected to the system bus 203. The memory controller is connected to and manages a system memory 207. Typically, the system memory 207 includes a plurality of DIMMs mounted side-by-side on a memory card which in turn is plugged into a motherboard within the enclosure 105.

Figure 3:
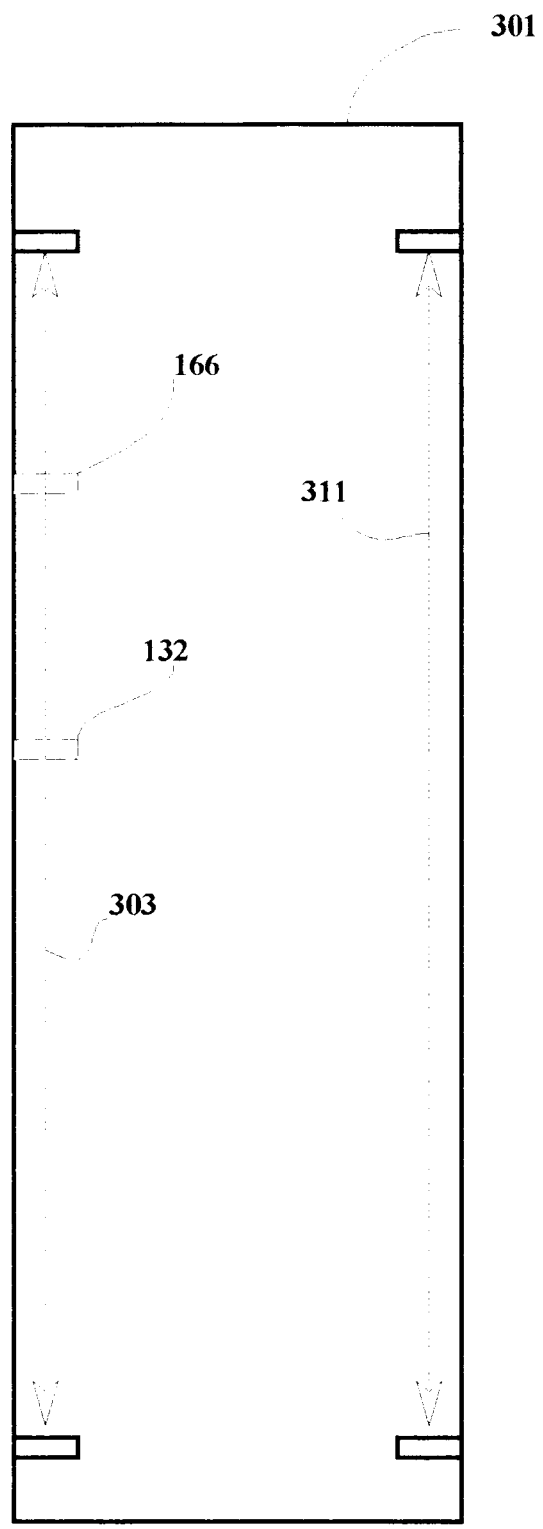
FIG. 3 is a drawing showing portions of a DIMM pin-out used to illustrate several typical signal pad connections.

An exemplary DIMM pin-out is illustrated in FIG. 3. A DIMM device slot 301 is arranged to receive a first series 303 of DIMM connection pins along the left side of the DIMM slot 301 and to receive a second series 311 of DIMM connection pins along the right side of the DIM slot 301. Each of the pins in the DIMM configuration is identified with a different signal or with no signal at all depending upon which kind of device is plugged-in. For example, DIMM pin 166 is designated as an SDRAM address (SA) pin if an SDRAM device is plugged-in, or a "presence detect" pin (PD) if a DRAM device is plugged into the DIMM slot. When used as a "presence detect" pin, a "0" logic level, for example, will be present on the pin if a DRAM device is plugged-in. Similarly, pin 132 is designated and used as a memory address pin for an SDRAM and as a "presence detect" pin for a DRAM.

Figures 4, 5:
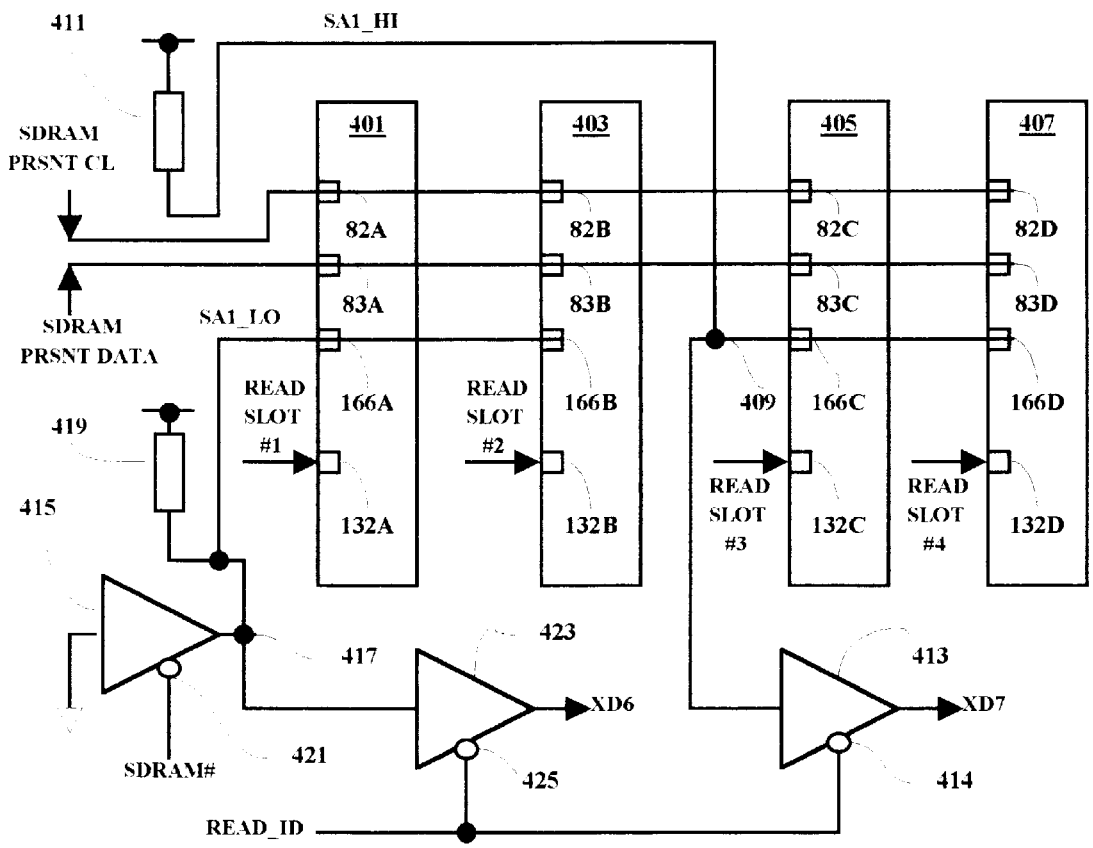
FIG. 4 is a schematic illustration showing a plurality of juxtaposed DIMM devices connected in accordance with the present invention.
FIG. 5 is a table showing exemplary addresses for the DIMM devices illustrated in FIG. 4.

As shown in FIG. 4, an exemplary arrangement includes four DIMM slots 401, 403, 405 and 407 which are positioned adjacent to each other, for example, on a memory card (not shown). Each of the DIMM slots 401, 403, 405 and 407 contains corresponding SA1/PD8 pin positions 166A, 166B, 166C and 166D, respectively. Each DIMM slot 401, 403, 405 and 407, also contains corresponding A13/PDE pin positions 132A, 132B, 132C and 132D, for selectively being connected to corresponding pins of DIMM devices. These pins individually enable the presence detection information for a given slot to be gated on to the presence detect bits, i.e. nodes 417 and 409.

As shown in FIG. 4, a logic "1" potential is connected through a pull-up resistor 411 to a common point 409 which is, in turn, connected to pin position 166C of DIMM slot 405 and also to pin position 166D of DIMM slot 407. An SDRAM PRSNT CL signal is applied to pin 82 of each slot 401, 403, 405 and 407. Similarly, an SDRAM PRSNT DATA signal is applied to pin 83, and READ SLOT (1–4) signals are applied to pin 132 of each of the four DIMM slots 401, 403, 405 and 407, respectively. The SDRAM PRSNT CL signal is used to clock a given slot to determine if an SDRAM DIMM is present. The SDRAM PRSNT DATA signal is used to read a given slot when a SDRAM is present in the slot. The READ SLOT (n) signals, i.e. READ SLOT #1 through READ SLOT #4 signals, are active low signals to indicate to the corresponding slots to output presence data if a DRAM is present. Common point 409 is also connected to an input of a gate device 413. The gate 413 is selectively operable to provide an output signal XD7 when a READ_ID signal is applied to its control terminal 414 and the SA1_HI signal at the input to the gate 413 is high. Another gate device 415 is arranged with its input terminal connected to a low logic level or ground in the present example. The output of the gate 415 is connected to a common terminal 417 which is connected to pin position 166A of DIMM slot 401 and also to pin position 166B of DIMM slot 403. Common point 417 is also connected through a pull-up resistor 419 to a logic "1" potential or high logic level in the present example. The gate 415 is controlled by an SDRAM# signal applied to the control terminal 421 of the gate 415. The common point 417 is also connected to an input terminal of another gate 423 which is selectively operable to provide an XD6 output signal when a READ_ID signal is applied to its control terminal 425. The XD6 signal output will be "0" if a DRAM device is installed in either of slots 401 or 403. Similarly, XD7 will be "0" if there is a DRAM device installed in either slot 405 or 407. Thus, if any of the slots have a DRAM device installed, either XD6 or XD7 will be at a logic "0" to so indicate.

The table illustrated in FIG. 5 shows the SDRAM Address (SA) bit values for each of the four DIMM slot locations 401, 403, 405 and 407, in which DIMM devices may be installed. It is noted that the SA1 bits will be at a logic "0" level when SDRAM DIMM devices are installed in either of the first two slots or positions corresponding to 401 and 403, and that the SA1 bits will be at a logic "1" level when there is an SDRAM DIMM device installed in DIMM slots or positions corresponding to 405 and 407. Thus by knowing if there is an SDRAM device installed in any of the four slots 410, 403, 405 and 407, or by determining the bit value at pin 166 for each device, it can be determined which slot has which type of DIMM device installed.

For example, when a DRAM device is installed in any of the four slots, the potential at pin slot 166 of the slot containing the DRAM will be at a low or "0" logic level. Therefore, if a logic level "1" or a high logic level is detected at pin slot 166 of any of the DIMM slots 401, 403, 405 or 407, that means an SDRAM is present in each slot where a "1" is detected. Since the slots cannot contain a mix of both SDRAM devices and DRAM devices, once a determination is made that an SDRAM device is present in any one of the slots by checking pin 166, it is known that each of the slots contains either an SDRAM device or is empty, and that no slot contains a DRAM device.

Figure 6:
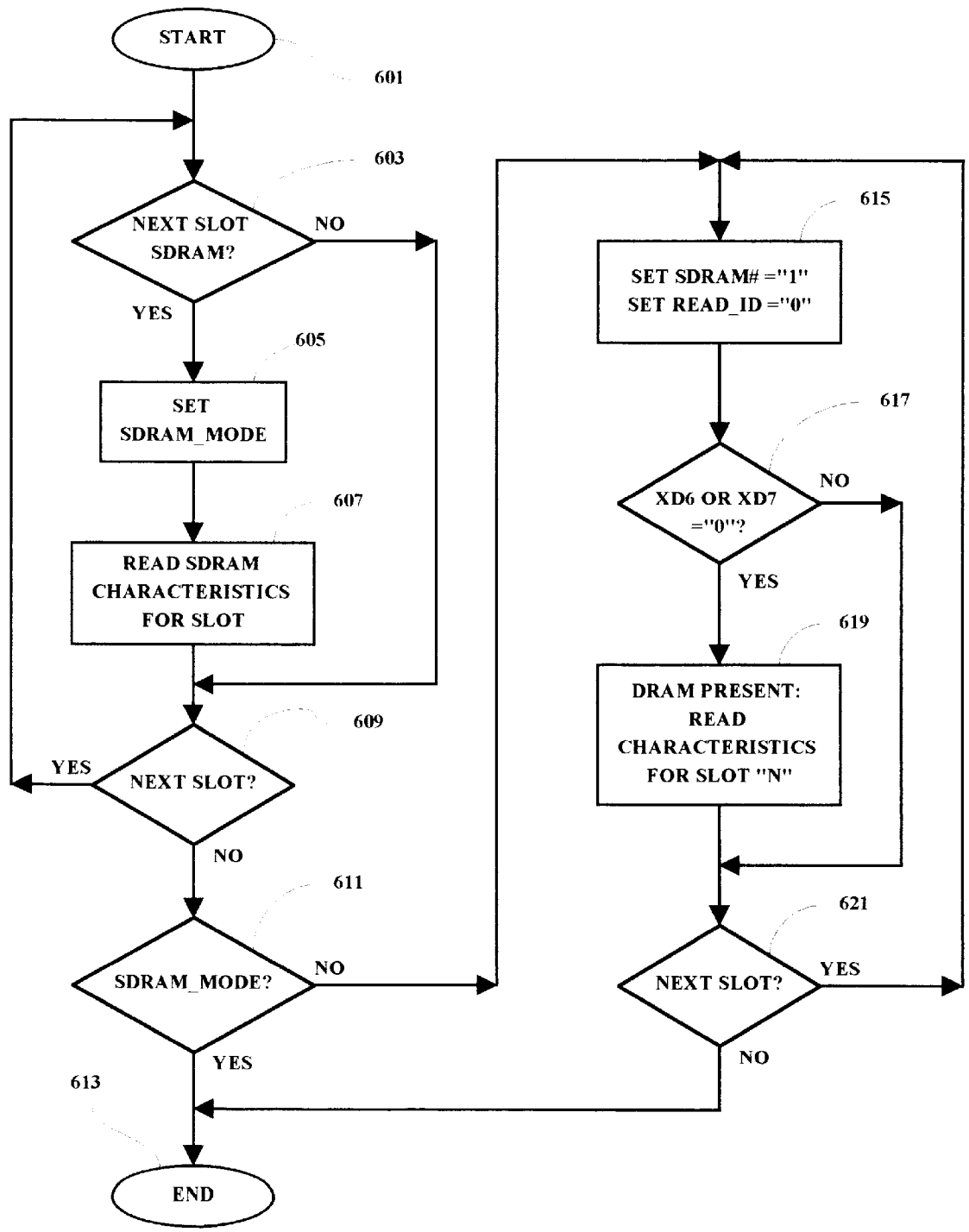
FIG. 6 is a flowchart illustrating an exemplary operational sequence for the disclosed methodology.

In FIG. 6, there is shown a flowchart for an exemplary operation of the detection circuitry shown in FIG. 5. As illustrated, when the operation starts 601, a determination is made 603 as to whether the first or next slot contains an SDRAM device. This is accomplished by detecting if there is an SDRAM present in any DIMM slot by reading SDRAM characteristic data using SDRAM_PRSNT_CLK and SDRAM_PRSNT_DATA signals. If the data record returned is valid, then an SDRAM DIMM is installed in that slot. Next, if an SDRAM is installed in the slot being analyzed, an "SDRAM" mode is set 605. It is noted that the system can contain SDRAM devices or DRAM devices but not a mixture of both. If any slot is detected to have an SDRAM device, then the SDRAM mode is set and the memory controller is set-up for SDRAM type of memory. Next, the SDRAM characteristics for the SDRAM device are read 607 and the operation continues by determining if there are any more slots 609. The SDRAM PRSNT CL and SDRAM PRSNT DATA signals are used to read the SDRAM DIMM characteristics. All of the four slots in the example are examined in this manner and all of the SDRAM characteristics for all of the installed devices are read. When it is detected that any of the slots does not contain an SDRAM 603, the process skips the "SET SDRAM_MODE" step 605, and the "READ SDRAM CHARACTERISTICS" step 607 and goes directly to the next slot 603. When all of the slots have been checked for the presence of an SDRAM, the process checks to determine if the SDRAM mode has been set 611. If the SDRAM mode has been set 611, the processing will end having completed reading in the SDRAM mode characteristics for all of the slots.

If the SDRAM mode has not been set 611 by the initial slot scanning process, the SDRAM# signal is set to a logic "1" level and the READ_ID signal is set to a logic "0" level 615. When the READ_ID signal is set, the appropriate READ_SLOT (n) signal is activated. A determination is then made as to whether XD6 (external data "6") or XD7

(external data "7") are at a logic "0" level 617. If either XD6 or XD7 are at a logic zero level in the present example, i.e. when pin 166 of any of the DIMM slots are at a logic "0" level, then it is determined that a DRAM DIMM is present, and the characteristics for the DRAM DIMM are read. This process also continues for all of the slots 621 until all of the slots have been examined, at which time the process will complete 613. If, during any of the slot examinations, neither XD6 or XD7 is equal to a "0" logic level 617, then that particular slot is determined to be empty of any devices and the processing skips to the next slot 621 for examination. In this manner, all of the DIMM slots are checked first for the presence of SDRAM devices, and then for DRAM devices while at the same time detecting which slots have devices installed and which slots are empty. The detected DIMM information is communicated to a memory controller to correctly configure the memory controller for the installed DIMMs.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art, and even included or integrated into a processor or CPU or other larger system integrated circuit or chip. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for identifying which of a plurality of types of memory modules is present within a memory module slot, said method comprising:

testing said memory module slot to determine if a memory module of a first type is present in said memory module slot;

setting a first memory type mode if a memory module of said first type is determined to be present in said memory module slot; and testing said memory module slot to determine if a memory module of a second type is present in said memory module slot if it is determined that a memory module of said first type is not present in said memory slot.

2. The method as set forth in claim 1 and further including a plurality of memory module slots, said method including scanning each of said plurality of memory module slots to determine if each of said memory module slots includes a memory module of said first or second type.

3. The method as set forth in claim 1 and further including reading characteristics of said memory module according to characteristics consistent with said first type of memory module to determine that a memory module of said first type is present in said memory slot.

4. The method as set forth in claim 1 and further including reading characteristics of said memory module according to characteristics consistent with said second type of memory module to determine that a memory module of said second type is present in said memory slot.

5. The method as set forth in claim 2 and further including reading characteristics of said plurality of memory modules according to characteristics consistent with said type of memory module determined to be present in each of said memory slots.

6. The method as set forth in claim 1 wherein said memory slot is a DIMM memory slot.

7. The method as set forth in claim 6 wherein said first type memory module is a SDRAM memory module.

8. The method as set forth in claim 6 wherein said second type memory module is a DRAM memory module.

9. A circuit comprising:

a first number of memory module connector slots, each of said memory module connector slots having a predetermined number of connector terminals arranged for being selectively connected to one of a plurality of types of memory modules;

control circuit means connected to said memory module connector slots, said control circuit means being selectively operable to detect module signals at predetermined ones of said connector terminals, said control circuit means being responsive to said module signals for providing module type signals representative of which of said types of said memory modules is connected to each of said memory module connector slots.

10. The circuit as set forth in claim 9 wherein said control circuit means further includes first control signal input means, said first control signal input means being selectively operable for applying a series of first control signals to a first set of predetermined ones of said connector terminals.

11. The circuit as set forth in claim 10 wherein said first control signals are operable to affect said module signals.

12. The circuit as set forth in claim 11 wherein said first control signal input means comprises pull-up resistors, said pull-up resistors being connected to said predetermined ones of said connector terminals.

13. The circuit as set forth in claim 10 wherein said control circuit means further includes a second control signal input means, said second control signal input means being selectively operable for applying a series of second control signals to a second set of predetermined ones of said connector terminals.

14. The circuit as set forth in claim 13 wherein said second control signals are operable to affect said module signals.

15. The circuit as set forth in claim 9 wherein said memory module connector slots are DIMM connectors.

16. The circuit as set forth in claim 9 wherein said types of said memory modules include SDRAM types and DRAM types of memory modules.

17. The circuit as set forth in claim 15 and further including a memory controller connected to said control circuit means, said memory controller being responsive to said module type signals for setting a mode of operation for said memory controller in accordance with said module type signals.

* * * * *